US012349583B2

(12) United States Patent
Chen et al.

(10) Patent No.: US 12,349,583 B2
(45) Date of Patent: Jul. 1, 2025

(54) TRANSISTOR AND MANUFACTURING METHOD THEREOF

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventors: Lixuan Chen, Huizhou (CN); Weiran Cao, Huizhou (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/620,221

(22) PCT Filed: Nov. 25, 2021

(86) PCT No.: PCT/CN2021/133039

§ 371 (c)(1),
(2) Date: Dec. 17, 2021

(87) PCT Pub. No.: WO2023/087353

PCT Pub. Date: May 25, 2023

(65) Prior Publication Data

US 2024/0138247 A1 Apr. 25, 2024

(30) Foreign Application Priority Data

Nov. 19, 2021 (CN) ......................... 202111373226.2

(51) Int. Cl.

*H10K 71/10* (2023.01)
*H01L 21/02* (2006.01)

(Continued)

(52) U.S. Cl.

CPC ..... *H10K 71/191* (2023.02); *H01L 21/02628* (2013.01); *H10D 99/00* (2025.01);

(Continued)

(58) Field of Classification Search

CPC combination set(s) only.
See application file for complete search history.

(56) References Cited

U.S. PATENT DOCUMENTS 7,868,410 B2 * 1/2011 Vereecken .............. C25D 3/50 438/585
2007/0114525 A1 5/2007 Lee (Continued)

FOREIGN PATENT DOCUMENTS

CN 101111927 A 1/2008
CN 102206225 A 10/2011

(Continued)

OTHER PUBLICATIONS

International Search Report in International application No. PCT/CN2021/133039, mailed on Jun. 23, 2022.

(Continued)

*Primary Examiner* — Mark W Tornow
*Assistant Examiner* — Priya M Rampersaud
(74) *Attorney, Agent, or Firm* — PV IP PC; Wei Te Chung

(57) ABSTRACT

The present application provides a manufacturing method of a transistor, including: providing a substrate, a solution, an active layer material and an auxiliary electrode; the active layer material is dispersed in the solution, and the active layer material is charged; positioning the auxiliary electrode on one side of the substrate; positioning the solution between the auxiliary electrode and the gate insulating layer; and electrifying the gate and the auxiliary electrode; an electrical property of the gate is opposite to an electrical property of the active layer material, and the active layer material is deposited on the gate insulating layer under an action of the electric field to form a source layer.

13 Claims, 4 Drawing Sheets

50
40
12
E
12
13
11

(51) Int. Cl.
*H10D 30/67* (2025.01)
*H10D 99/00* (2025.01)
*H10K 10/46* (2023.01)
*H10K 71/12* (2023.01)

(52) U.S. Cl.
CPC ......... *H10K 71/12* (2023.02); *H10D 30/6755* (2025.01); *H10K 10/466* (2023.02); *H10K 10/484* (2023.02)

(56) References Cited

U.S. PATENT DOCUMENTS

2010/0051938 A1* 3/2010 Hayashi ............ H10D 30/6755 257/E29.296
2014/0080274 A1 3/2014 Park et al.
2015/0307360 A1* 10/2015 Bills .................. H01M 4/0457 428/323
2016/0005599 A1* 1/2016 Lee ..................... H10D 62/121 136/265
2017/0278874 A1* 9/2017 Yamazaki .......... H01L 29/7782
2018/0011364 A1* 1/2018 Deng .................... H05B 33/28

FOREIGN PATENT DOCUMENTS

| CN | 105514039 A | 4/2016 |
| --- | --- | --- |
| CN | 107903712 A | 4/2018 |
| CN | 111490093 A | 8/2020 |
| CN | 113345940 A | 9/2021 |

OTHER PUBLICATIONS

Written Opinion of the International Search Authority in International application No. PCT/CN2021/133039, mailed on Jun. 23, 2022.
Chinese Office Action issued in corresponding Chinese Patent Application No. 202111373226.2 dated Apr. 30, 2025, pp. 1-11.

* cited by examiner

TRANSISTOR AND MANUFACTURING METHOD THEREOF

CROSS-REFERENCE TO RELATED APPLICATION

This application is a national phase application under 35 U.S.C. § 371 of PCT Application No. PCT/CN2021/133039, filed Nov. 25, 2021, which claims priority to Chinese Application No. 202111373226.2, filed Nov. 19, 2021, the contents of which are incorporated herein by reference in their entirety.

FIELD OF THE INVENTION

This application relates to a technical field of transistors, and more particularly relates to a transistor and a manufacturing method thereof.

BACKGROUND OF THE INVENTION

A bottom-gate transistor is a type of transistor. The gate of the bottom-gate transistor is formed on a base substrate, and an active layer is formed above the gate and is separated from the gate insulating layer. In the prior art, the active layer is generally deposited by a chemical vapor deposition process to form an initial film of the active layer, and then the initial film of the active layer is patterned by dry etching to form the active layer. Since there is a gate insulating layer between the gate and the active layer, the gate insulating layer is opaque. During dry etching, the gate insulating layer will affect the effective self-alignment of the active layer and the gate.

SUMMARY OF THE INVENTION

It is an objective of the present application how to solve the technical problem that the active layer and the gate cannot be effectively self-aligned.

First, the present application provides a manufacturing method of a transistor, comprising:

- providing a substrate, a solution, an active layer material and an auxiliary electrode; wherein the substrate comprises a base substrate, at least one gate and a gate insulating layer which are sequentially stacked together; the active layer material is dispersed in the solution, and the active layer material dispersed in the solution is charged;
- positioning the auxiliary electrode on one side of the substrate for facing the gate; positioning the solution between the auxiliary electrode and the gate insulating layer; and
- electrifying the gate and the auxiliary electrode to form an electric field between the auxiliary electrode and the gate; wherein an electrical property of the gate is opposite to an electrical property of the active layer material in the solution, and the active layer material is deposited on the gate insulating layer under an action of the electric field to form a source layer.

In an optional embodiment of this application, the solution is coated or dropped on the gate insulating layer.

In an optional embodiment of this application, the electric field is a vertical electric field or a horizontal electric field.

In an optional embodiment of this application, the auxiliary electrode faces the gate insulating layer; one auxiliary electrode corresponds to one gate.

In an optional embodiment of this application, a plurality of the auxiliary electrodes is formed on one auxiliary substrate, and the auxiliary substrate is located above the substrate.

In an optional embodiment of this application, the auxiliary electrode is located on the base substrate and adjacent to at least one of the gates.

In an optional embodiment of this application, the auxiliary electrode is located between adjacent two of the gates.

In an optional embodiment of this application, the auxiliary electrode and the gates are located on a same surface of the base substrate.

In an optional embodiment of this application, the auxiliary electrode and the gates are located on opposite surfaces of the base substrate.

In an optional embodiment of this application, the auxiliary electrode is grounded.

In an optional embodiment of this application, one of the two adjacent gates serves as the auxiliary electrode.

In an optional embodiment of this application, the active layer material is at least one of oxide semiconductors, quantum dots, a perovskite material and an organic semiconductor material.

In an optional embodiment of this application, a solvent of the solution is a polar solvent or a non-polar solvent.

In an optional embodiment of this application, the active layer material is positively or negatively charged in the solution;

- when the active layer material is positively charged in the solution, the electrical property of the gate is negative, and the electrical property of the auxiliary electrode is positive; and
- when the active layer material is negatively charged in the solution, the electrical property of the gate is positive, and the electrical property of the auxiliary electrode is negative.

In an optional embodiment of this application, a mass percentage of the active layer material in the solution is defined as W %, and a thickness of the active layer formed by deposition is h, and a height of the solution is H, and a density of the active layer formed by deposition is $\rho$, and then $W\% = \rho * h/H$.

In an optional embodiment of this application, the active layer comprises a channel region, and the manufacturing method of the transistor further comprises:

forming a source and drain layer on the active layer, wherein the source and drain layer comprises a source and a drain, and the channel region right faces a gap between the source and the drain, which are adjacent.

The present application provides a transistor, comprising a base substrate, at least one gate, a gate insulating layer and an active layer which are sequentially stacked together, wherein the active layer is formed on the gate insulating layer and the active layer is right faces the gate; the active layer is formed on the gate insulating layer by employing an electrodeposition process, and orthographic projections of the active layer and the gate on the base substrate completely overlap.

In an optional embodiment of this application, the transistor further comprises an auxiliary electrode on the base substrate, and the auxiliary electrode is positioned between two of the gates, and the auxiliary electrode and the gates are located on a same surface of the base substrate.

In the manufacturing method of the transistor provided by the present application, the active layer material is dispersed in a polar or non-polar solvent to make the active layer material conductive. By utilizing the auxiliary electrode and electrifying the auxiliary electrode and the bottom gate (the electric property of the bottom gate is opposite to that of the active layer material), a horizontal or vertical electric field can be formed between the auxiliary electrode and the bottom gate. The charged active layer material is deposited on the gate insulating layer under an action of the electric field to form the active layer of the transistor. Since the electric force line between the bottom gate and the auxiliary electrode starts from the positive electrode and stops at the negative electrode, there is no external expansion. Therefore, orthographic projections of the deposited active layer and the bottom gate on the base substrate completely overlap, so that the bottom gate and the active layer can be self-aligned.

BRIEF DESCRIPTION OF THE DRAWINGS

In order to more clearly illustrate the embodiments of the present application, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Figure 1:
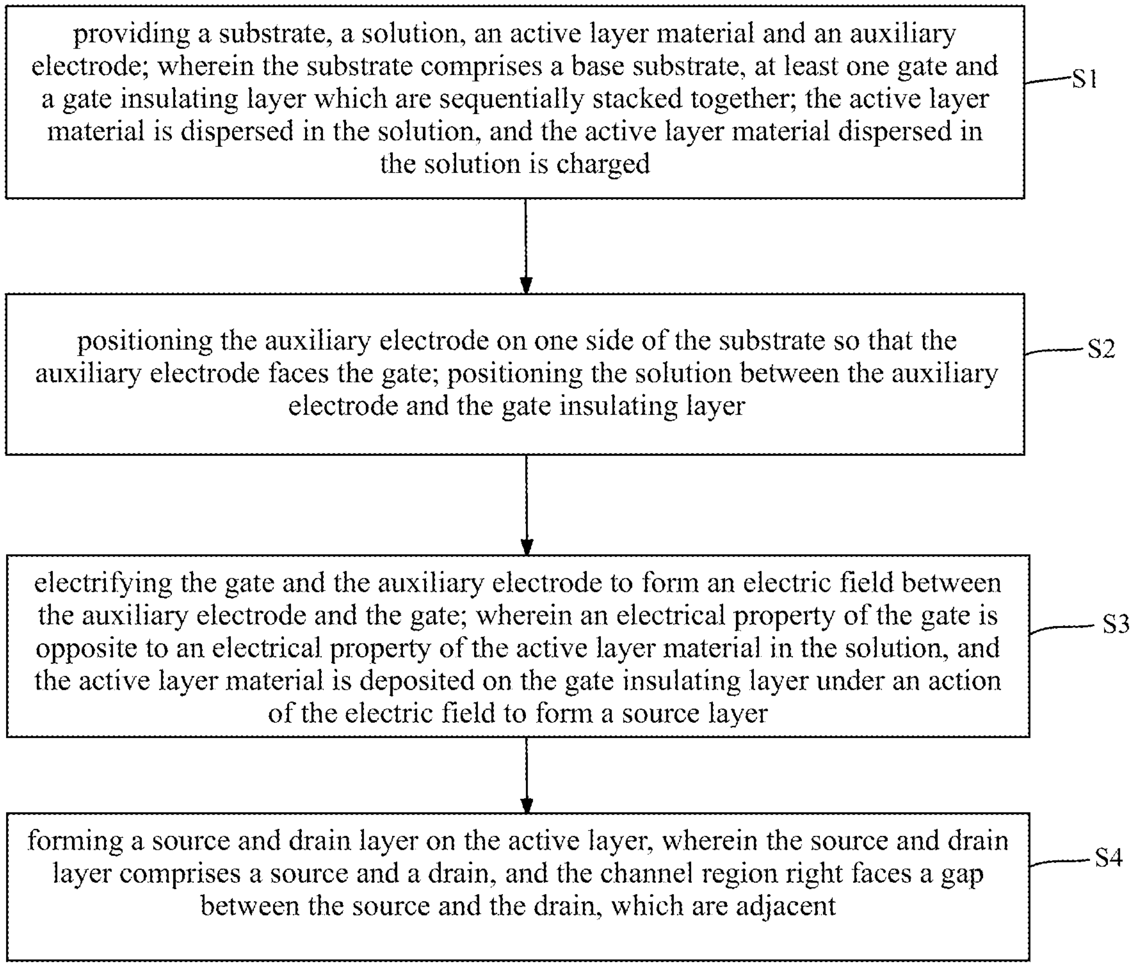
FIG. 1 is a flowchart of a manufacturing method of a transistor provided by a preferred embodiment of the application.

For better explaining the technical solution and the effect of the present invention, the present invention will be further described in detail with the accompanying drawings in the specific embodiments. It is clear that the described embodiments are merely part of embodiments of the present application, but not all embodiments. Based on the embodiments of the present application, all other embodiments to those of skilled in the premise of no creative efforts obtained, should be considered within the scope of protection of the present application.

In the description of the present application, it is to be understood that the terms "upper" and "lower", etc. are positional relationships based on the orientations or positional relationships shown in the drawings, and are merely for the convenience of the description of the present application and the simplified description, and do not indicate or imply that the device or component referred to have specific orientations, and are constructed and operated in specific orientations. Therefore, these should not be construed as limiting the present application. Moreover, the terms "first" and "second" are used for descriptive purposes only and are not to be construed as indicating or implying a relative importance or implicitly indicating the number of indicated technical features. Thus, features defining "first" and "second" may include one or more of the features with either explicitly or implicitly. In the description of the present application, "plurality" means two or more unless with being specifically indicated otherwise.

The present application may be repeated with reference to the numerals and/or reference numerals in the various embodiments, which are for the purpose of simplicity and clarity, and do not indicate the relationship between the various embodiments and/or arrangements discussed.

The present application addresses the technical problem that the existing bottom gate and active layer cannot be self-aligned. In the manufacturing method of the transistor provided by the present application, the active layer material is dispersed in a polar or non-polar solvent to make the active layer material conductive. By utilizing the auxiliary electrode and electrifying the auxiliary electrode and the bottom gate (the electric property of the bottom gate is opposite to that of the active layer material), a horizontal or vertical electric field can be formed between the auxiliary electrode and the bottom gate. The charged active layer material is deposited on the gate insulating layer under an action of the electric field to form the active layer of the transistor. Since the electric force line between the bottom gate and the auxiliary electrode starts from the positive electrode and stops at the negative electrode, there is no external expansion. Therefore, orthographic projections of the deposited active layer and the bottom gate on the base substrate completely overlap, so that the bottom gate and the active layer can be self-aligned.

Figure 2:
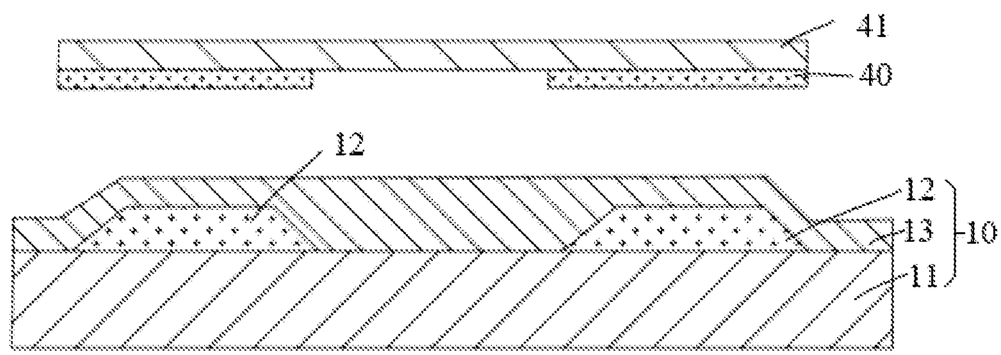
FIG. 2 is a cross-sectional view diagram of a substrate, an auxiliary electrode and a solution dispersed with an active layer material provided by a preferred embodiment of the application.

Referring to FIGS. 1-5, a preferred embodiment of the present application provides a manufacturing method of a transistor 100, which comprises steps of:

Step S1, referring to FIG. 1 and FIG. 2, providing a substrate 10, a solution (not shown in figures), an active layer material (not shown in figures) and an auxiliary electrode 40; wherein the substrate 10 comprises a base substrate 11, at least one gate 12 and a gate insulating layer 13 which are sequentially stacked together; the active layer material 30 is dispersed in the solution 20, and the active layer material 30 dispersed in the solution 20 is charged.

A solvent of the solution is a polar solvent or a non-polar solvent.

The active layer material is at least one of oxide semiconductors, quantum dots, a perovskite material and an organic semiconductor material. Specifically, the organic semiconductor material may be pentacene or the like.

As regarding the polar solvent, organic matter can lose an OH− or H+, and the remaining groups will be charged. The surface of nanoparticles can be modified with ligands. After the ligand loses H+ or OH−, the surface of the nanoparticles is charged. Therefore, the active layer material is positively or negatively charged in the solution.

A mass percentage of the active layer material in the solution is defined as W %, and a thickness of the active layer formed by deposition is h, and a height of the solution is H, and a density of the active layer formed by deposition is ρ, and then $W\%=\rho*h/H$.

Step S2, referring to FIG. 1, FIG. 2, FIG. 4 and FIG. 5, positioning the auxiliary electrode 40 on one side of the substrate 10 for facing the gate 12; positioning the solution between the auxiliary electrode 40 and the gate insulating layer 13.

Specifically, the solution is coated or dropped on the gate insulating layer 13.

Referring to FIG. 2, in an optional embodiment of this application, the auxiliary electrode 40 faces the gate insulating layer 13; one auxiliary electrode 40 corresponds to one gate 12.

Referring to FIG. 2, in an optional embodiment of this application, a plurality of the auxiliary electrodes 40 are formed on one auxiliary substrate 41, and the auxiliary substrate 41 is located above the substrate 10.

Figure 4:
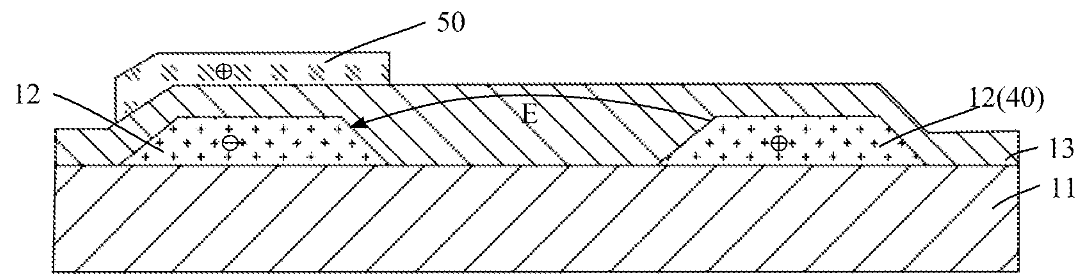
FIG. 4 is a diagram of deposition of an active layer material provided by another embodiment of the application under an action of an electric field.

Referring to FIG. 4, in an optional embodiment of this application, one of the two adjacent gates 12 serves as the auxiliary electrode 40.

Figure 5:
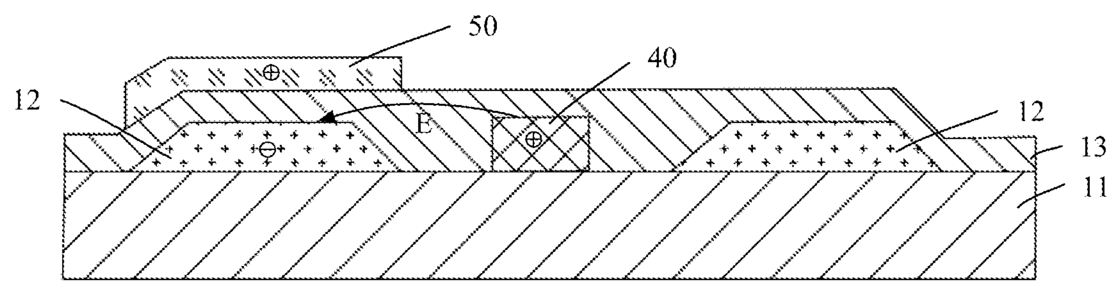
FIG. 5 is a diagram of deposition of an active layer material provided by one another embodiment of the application under an action of an electric field.

Referring to FIG. 5, in an optional embodiment of this application, the auxiliary electrode 40 is located on the base substrate 11 and adjacent to at least one of the gates 12. Specifically, the auxiliary electrode 40 is located between adjacent two of the gates 12.

In an optional embodiment of this application, the auxiliary electrode 40 and the gates 12 are located on a same surface of the base substrate 11.

In an optional embodiment of this application, the auxiliary electrode 40 and the gates 12 are located on opposite surfaces of the base substrate 11.

In an optional embodiment of this application, the auxiliary electrode 40 is grounded.

Figure 3:
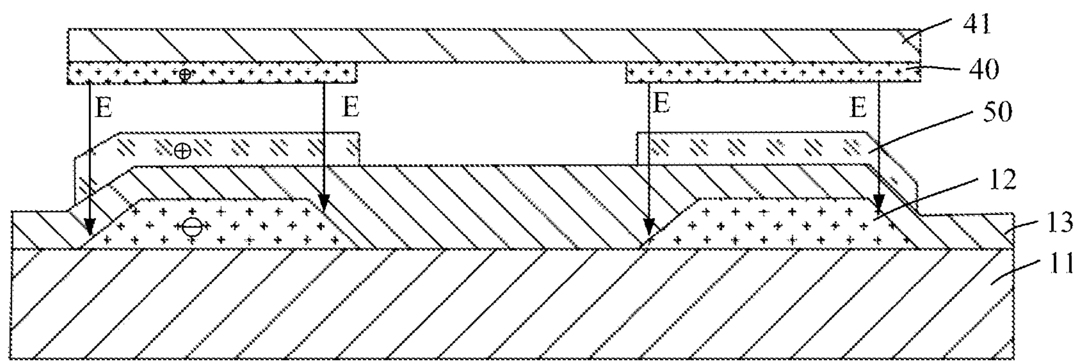
FIG. 3 is a diagram of deposition of an active layer material provided by an embodiment of the application under an action of an electric field.

Step S3, referring to FIG. 1, FIG. 3 and FIG. 5, electrifying the gate 12 and the auxiliary electrode 40 to form an electric field E between the auxiliary electrode 40 and the gate 12; wherein an electrical property of the gate 12 is opposite to an electrical property of the active layer material in the solution, and the active layer material is deposited on the gate insulating layer under 13 an action of the electric field E to form a source layer 50.

The active layer 50 comprises a channel region 51.

In an optional embodiment of this application, the electric field E is a vertical electric field or a horizontal electric field.

When the active layer material is positively charged in the solution, the electrical property of the gate 12 is negative, and the electrical property of the auxiliary electrode 40 is positive; and when the active layer material is negatively charged in the solution, the electrical property of the gate 12 is positive, and the electrical property of the auxiliary electrode 40 is negative.

Since the electrical property of the gate 12 is opposite to the electrical property of the active layer material in the solution, under the action of the electric field E, the active layer material will move in a direction of the gate 12 and to be deposited on the gate insulating layer 13.

In an optional embodiment of this application, the electric field E is a vertical electric field or a horizontal electric field.

Specifically, referring to FIG. 3, since the auxiliary electrode 40 is located above the gate insulating layer 13, when the auxiliary electrode 40 and the gate 12 are supplied with electricity with opposite electrical properties, for instance: the electrical property of the auxiliary electrode 40 is positive and the electrical property of the gate 12 is negative, the electrical property of the active layer material is positive, and the electric field E is formed between the auxiliary electrode 40 and the gate 12, and the electric field E is a vertical electric field, and the electric force lines are directed from the auxiliary electrode 40 as the positive electrode to the gate 12 as the negative electrode, and the active layer material is deposited on the gate insulating layer under 13 an action of the electric field E to form a source layer 50. Certainly, the electrical property of the auxiliary electrode 40 can be negative and the electrical property of the gate 12 is positive, the electrical property of the active layer material is negative.

Specifically, referring to FIG. 4, in an optional embodiment of the present application, the electrical properties of the two adjacent gates 12 are opposite, and a horizontal electric field is formed between the two adjacent gates 12 because the active layer material is deposited at a position of the gate insulating layer 13 corresponding to the gate 12 that is electrically opposite to the active layer material.

Specifically, referring to FIG. 5, in an optional embodiment of the present application, the one of auxiliary electrodes 40 is located between two of the gates 12. When the electrical properties of one of the gates 12 and the auxiliary electrode 40 are opposite, a horizontal electric field will be formed between the gate 12 and the auxiliary electrode 40.

In other embodiments, it is also possible to electrify the two adjacent gates 12 with the same electrical property, which is opposite to the electrical property of the auxiliary electrode 40. Then, two of the active layers 50 corresponding to the two gates 12 can be deposited at the same time.

Figure 6:
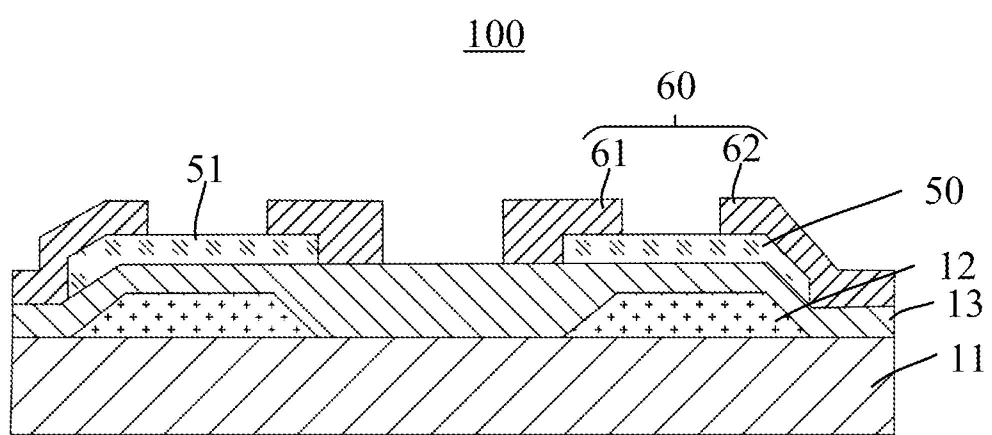
FIG. 6 is a cross-sectional view diagram of forming a source and drain layer on the active layer to form a transistor provided by a preferred embodiment of the application.

Step S4, referring to FIG. 6, forming a source and drain layer 60 on the active layer 50, wherein the source and drain layer 60 comprises a source 61 and a drain 62, and the channel region 51 right faces a gap between the source 61 and the drain 62, which are adjacent.

Referring to FIG. 6, the present application further provides a transistor 100. The transistor 100 comprises a base substrate 11, at least one gate 12, a gate insulating layer 13 and an active layer 50 which are sequentially stacked together, wherein the active layer 50 is formed on the gate insulating layer 13 and the active layer 50 is right faces the gate 12; the active layer 50 is formed on the gate insulating layer 13 by employing an electrodeposition process, and orthographic projections of the active layer 50 and the gate 12 on the base substrate 11 completely overlap. For the electrodeposition process, reference may be made to Step S1 to Step S3 as aforementioned.

In an optional embodiment of the present application, the transistor 100 further comprises an auxiliary electrode 40 located on the substrate 11. The auxiliary electrode 40 is located between adjacent two of the gates 12. The gates 12 and the auxiliary electrode 40 are located on the same surface of the base substrate 11.

Certainly, the transistor 100 further comprises a passivation layer (not shown in figures) and a planarization layer (not shown in figures) covering the source and drain layer 60.

The present application further provides an array substrate (not shown in figures). The array substrate comprises the transistor 100, an anode (not shown in figures) formed on the planarization layer, a pixel definition layer (not shown in figures) formed on the anode and a light emitting unit. The anode penetrates the planarization layer and the passivation layer and is electrically connected to the source and drain layer. The pixel definition layer possesses a plurality of pixel openings, and the light emitting unit is located in the pixel opening.

In the manufacturing method of the transistor provided by the present application, the active layer material is dispersed in a polar or non-polar solvent to make the active layer material conductive. By utilizing the auxiliary electrode and electrifying the auxiliary electrode and the bottom gate (the electric property of the bottom gate is opposite to that of the active layer material), a horizontal or vertical electric field can be formed between the auxiliary electrode and the bottom gate. The charged active layer material is deposited on the gate insulating layer under an action of the electric field to form the active layer of the transistor. Since the electric force line between the bottom gate and the auxiliary electrode starts from the positive electrode and stops at the negative electrode, there is no external expansion. Therefore, orthographic projections of the deposited active layer and the bottom gate on the base substrate completely overlap, so that the bottom gate and the active layer can be self-aligned.

The transistor and manufacturing method thereof provided by the embodiments of the present application is described in detail as aforementioned, and the principles and implementations of the present application have been described with reference to specific illustrations. The description of the foregoing embodiments is merely for helping to understand the technical solutions of the present application and the core ideas thereof; those skilled in the art should understand that the technical solutions described in the foregoing embodiments may be modified, or some of the technical features may be equivalently replaced; and the modifications or replacements do not deviate from the spirit and scope of the technical solutions of the embodiments of the present application.

In summary, although the above preferred embodiments of the present invention are disclosed, the foregoing preferred embodiments are not intended to limit the invention, those skilled in the art can make various kinds of alterations and modifications without departing from the spirit and scope of the present invention. Thus, the scope of protection of the present invention is defined by the scope of the claims.

What is claimed is:

1. A manufacturing method of a transistor, comprising:

providing a substrate, a solution, an active layer material and one or more auxiliary electrodes; wherein the substrate comprises a base substrate, at least one gate and a gate insulating layer which are sequentially stacked together; the active layer material is dispersed in the solution, and the active layer material dispersed in the solution is charged;

positioning the one or more auxiliary electrodes on one side of the substrate; coating or dropping the solution on the gate insulating layer; and electrifying the gate and the auxiliary electrode to form an electric field between the auxiliary electrode and the gate; wherein an electrical property of the gate is opposite to an electrical property of the active layer material in the solution, and the active layer material is deposited on the gate insulating layer under an action of the electric field to form a source layer;

wherein the auxiliary electrode is located on the base substrate and adjacent to the at least one gate.

2. The manufacturing method of the transistor according to claim 1, wherein the electric field is a vertical electric field or a horizontal electric field.

3. The manufacturing method of the transistor according to claim 2, wherein one of the two adjacent gates serves as the auxiliary electrode.

4. The manufacturing method of the transistor according to claim 1, wherein the active layer material is at least one of oxide semiconductors, quantum dots, a perovskite material and an organic semiconductor material.

5. The manufacturing method of the transistor according to claim 1, wherein a solvent of the solution is a polar solvent or a non-polar solvent.

6. The manufacturing method of the transistor according to claim 1, wherein the active layer material is positively or negatively charged in the solution;

when the active layer material is positively charged in the solution, the electrical property of the gate is negative, and the electrical property of the auxiliary electrode is positive; and when the active layer material is negatively charged in the solution, the electrical property of the gate is positive, and the electrical property of the auxiliary electrode is negative.

7. The manufacturing method of the transistor according to claim 1, wherein a mass percentage of the active layer material in the solution is defined as W %, and a thickness of the active layer formed by deposition is h, and a height of the solution is H, and a density of the active layer formed by deposition is ρ, and then $W\ \%=\rho*h/H$.

8. The manufacturing method of the transistor according to claim 1, wherein the active layer comprises a channel region, and the manufacturing method of the transistor further comprises:

forming a source and drain layer on the active layer, wherein the source and drain layer comprises a source and a drain, and the channel region right faces a gap between the source and the drain, which are adjacent.

9. The manufacturing method of the transistor according to claim 8, further comprising:

forming a planarization layer on the source and drain layer.

10. A manufacturing method of an transistor, comprising:

providing a substrate, a solution, an active layer material and one or more auxiliary electrodes; wherein the substrate comprises a base substrate, at least one gate and a gate insulating layer which are sequentially stacked together; the active layer material is dispersed in the solution, and the active layer material dispersed in the solution is charged;

positioning the one or more auxiliary electrodes on one side of the substrate; coating or dropping the solution on the gate insulating layer; and electrifying the gate and the auxiliary electrode to form an electric field between the auxiliary electrode and the gate; wherein an electrical property of the gate is opposite to an electrical property of the active layer material in the solution, and the active layer material is deposited on the gate insulating layer under an action of the electric field to form a source layer;

wherein the electric field is a vertical electric field or a horizontal electric field;

wherein the auxiliary electrode is located on the base substrate and adjacent to the at least one gate.

11. The manufacturing method of the transistor according to claim 10, wherein one or more auxiliary electrodes is located between adjacent two of the gates.

12. The manufacturing method of the transistor according to claim 11, wherein the one or more auxiliary electrodes and the gates are located on a same surface of the base substrate.

13. The manufacturing method of the transistor according to claim 11, wherein the one or more auxiliary electrodes are grounded.

* * * * *